US012799966B2

(12) United States Patent
Sattler et al.

(10) Patent No.: US 12,799,966 B2
(45) Date of Patent: Nov. 17, 2026

(54) SPRINGLOADED RIVET FOR RADAR WAVEGUIDE PCBA INTERFACE

(71) Applicant: GM Cruise Holdings LLC, San Francisco, CA (US)

(72) Inventors: Mathias Sattler, Starnberg (DE); Kilian Stach, Munich (DE); Sebastian Mann, Munich (DE)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 344 days.

(21) Appl. No.: 18/414,410

(22) Filed: Jan. 16, 2024

(65) Prior Publication Data

US 2025/0223992 A1 Jul. 10, 2025

(30) Foreign Application Priority Data

Jan. 5, 2024 (EP) .................................... 24150505

(51) Int. Cl.

*F16B 19/10* (2006.01)
*H01P 3/12* (2006.01)
*H05K 1/02* (2006.01)

(52) U.S. Cl.

CPC .......... *F16B 19/1045* (2013.01); *H01P 3/121* (2013.01); *H05K 1/0243* (2013.01); *H05K 2201/10098* (2013.01); *H05K 2201/10151* (2013.01)

(58) Field of Classification Search

CPC ... F16B 19/1045; H01P 3/121; H05K 1/0243; H05K 2201/068; H05K 2201/09985; H05K 2201/10098; H05K 2201/10151; H05K 2201/10265; H05K 2201/10409; H05K 3/301

See application file for complete search history.

(56) References Cited

U.S. PATENT DOCUMENTS

| | | | | |
|---|---|---|---|---|
| 3,192,821 A * | 7/1965 | Siebol | F16B 19/1054 | 411/41 |
| 3,848,947 A * | 11/1974 | Jambor | H01R 12/718 | 439/817 |
| 2008/0057786 A1* | 3/2008 | Gu | H01R 13/6583 | 439/607.01 |
| 2013/0069835 A1* | 3/2013 | Swais | H01Q 1/3275 | 333/32 |

(Continued)

FOREIGN PATENT DOCUMENTS

KR 20050049629 A * 5/2005

OTHER PUBLICATIONS

KR20050049629 translation (Year: 2005).*

(Continued)

*Primary Examiner* — Timothy A Brainard
(74) *Attorney, Agent, or Firm* — CANTOR COLBURN LLP

(57) ABSTRACT

A printed circuit board assembly (PCBA) waveguide assembly comprises a PCBA, a waveguide, and a spring-loaded rivet. The spring-loaded rivet comprises a rivet head, a rivet shank, a rivet tail, and a spring element and fastens the PBCA to the waveguide. The spring element provides flexibility in the clamping force of the rivet to accommodate thermal expansion and contraction, creeping and shear forces experienced by the PCBA and waveguide.

20 Claims, 12 Drawing Sheets

(56) References Cited

U.S. PATENT DOCUMENTS

| | | | | |
|---|---|---|---|---|
| 2015/0171674 A1* | 6/2015 | Lee | H02K 29/00 | |
| | | | 310/46 | |
| 2015/0285288 A1* | 10/2015 | Gaertner | F16B 19/1036 | |
| | | | 411/510 | |
| 2020/0181967 A1* | 6/2020 | Schweizer | E05F 15/622 | |
| 2022/0368011 A1* | 11/2022 | Yoo | H01Q 13/12 | |
| 2024/0401681 A1* | 12/2024 | Kee | F16B 19/06 | |

OTHER PUBLICATIONS

Anonymous Ed Darl Kuhn: "Alternative design for spring-loaded heatsink attach fastener", ip.com, ip.com Inc., West Henrietta, NY, US, Jun. 11, 2001 (Jun. 11, 2001), XP013000448, ISSN: 1533-0001.
Anonymous: Infrared Wikipedia•, Aug. 25, 2022 (Aug. 25, 2022), pp. 1-19, XP093168836, Retrieved from the Internet: URL:https://en.wikipedia.org/w/index.php?title=Infrared&oldid=1106595552.
Anonymous: "Waveguide Wikipedia", May 9, 2023 (May 9, 2023), pp. 1-8, XP093168825, Retrieved from the Internet: URL:https://en.wikipedia.org/w/index.php?title=Waveguide&oldid=1153911688.
European Search Report for European Application No. EP24150505; dated May 31, 2024; 2 pages.
Richco: "Catalog", Product Catalog, Jun. 14, 2010 (Jun. 14, 2010), pp. i-216, XP055490611, usRetrieved from the Internet: URL:http://www.acfcom.com/richco/catalog-2 9 .pdf.

* cited by examiner

SPRINGLOADED RIVET FOR RADAR WAVEGUIDE PCBA INTERFACE

BACKGROUND

Autonomous or assisted driving strategies have been facilitated through sensing an environment around a vehicle. Radar sensors are conventionally used in connection with detecting and classifying objects in an environment. Radar is particularly robust with regard to lighting and weather conditions. Often, radar sensors are deployed with cameras and/or lidar sensors to provide different modes of detection and redundancy. In certain scenarios, performance of lidar and/or cameras can be supplemented by radar when affected by environmental features, such as temperature, fog, rain, snow, bright sunlight, lack of adequate light, etc. Waveguides can be employed to assist in capturing and/or channeling high frequency signals, such as radar signals.

Conventional approaches to coupling a printed circuit board assembly (PCBA) to a waveguide include using rigid fasteners such as screws or bolts to secure the PCBA and the waveguide together. However shear stresses, which may be caused by thermal expansion and contraction perpendicular to the fastener axis, can negatively affect the effectiveness of the fastener.

Another problem that affects fasteners such as screws and bolts is "creeping." Creeping results in a large loss of clamping force and is exacerbated by factors such as time. Thermal expansion and contraction also contribute to creeping and occurs where the waveguide, PCBA, and/or the fastener have different coefficients of thermal expansion (CTE). Thermal expansion in the fastener axis direction or perpendicular to the fastener access direction can deleteriously affect the effectiveness of the fastener.

Additionally, when the waveguide and the PCBA have different thermal expansion coefficients, they may expand and contract at different rates which can cause undesirable gaps between the waveguide and the PCBA. When these gaps are present, one or both of the waveguide and the PCBA may not function properly. Conventional approaches have not satisfactorily addressed problems created by shear forces and thermal expansion when securing antenna component parts together.

SUMMARY

The following is a brief summary of subject matter that is described in greater detail herein. This summary is not intended to be limiting as to the scope of the claims.

Described herein are various technologies relating to securely fastening electronic components together while accommodating component shifting due to events such as thermal expansion and contraction, component creeping, and the like. "Creeping" refers to the tendency of materials to become deformed over time under persistent mechanical stresses. Conventional mechanical fasteners such as screws and common rivets can cause creeping in waveguide and PCBA materials. These fasteners also are unforgiving when the waveguide and PCBA materials undergo thermal expansion or contraction. This can result in the fastener working itself loose over time, which compromises the interface between the waveguide and the PCBA.

Creep can be exacerbated further in materials that are subjected to heat for extensive time periods, such as in hotter climates. The rate of material deformation can be affected by temperature, exposure time, material tolerance, structural load, etc. Over time, material deformation can become so extreme that the device or material function is compromised.

In order to overcome these problems, described herein is a spring-loaded rivet fastener that provides flexibility to the force supplied by the rivet in order to accommodate thermal expansion and contraction, creeping, shear forces, etc., of the material fastened together by the spring-loaded rivet, thereby extending the lifetime the device components fastened together by the spring-loaded rivet.

In one embodiment, a spring element is positioned around the rivet shank adjacent to the rivet head. A mandrel having a head portion and a shank portion is inserted into the rivet tail until the mandrel head abuts the rivet tail. The mandrel shank extends through the rivet shank and out through the rivet head. The rivet is then inserted into a rivet channel through the PCBA and the waveguide, and ultimately into a rivet chamber formed in the waveguide that accommodates the rivet tail. The mandrel shank is pulled through the rivet head, causing the mandrel head to deform the rivet tail toward the rivet head. The mandrel shank is designed to break when the rivet head and the rivet tail are properly clamped to securely hold the waveguide and the PCBA together. The spring element compresses during waveguide and PCBA expansion and elongates during waveguide and PCBA contraction to provide a constant rivet clamping force. The spring element also accommodates creeping and shear force events.

In one embodiment, the spring element is a wire spring. The wire spring can be flat wire, round wire, or any other suitable type of wire spring. In another embodiment, the spring element is a bushing or the like and comprises an elastic material having a desired elasticity for providing the spring functionality described herein. In another embodiment, the spring element is a sheet metal or plastic spring that is compressible during rivet installment and flexible to provide consistent rivet clamping force during thermal expansion and contraction of the waveguide and PCBA.

In another embodiment, the waveguide and PCBA are components of a radar sensor. In yet another embodiment, the radar sensor is deployed on an autonomous vehicle.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
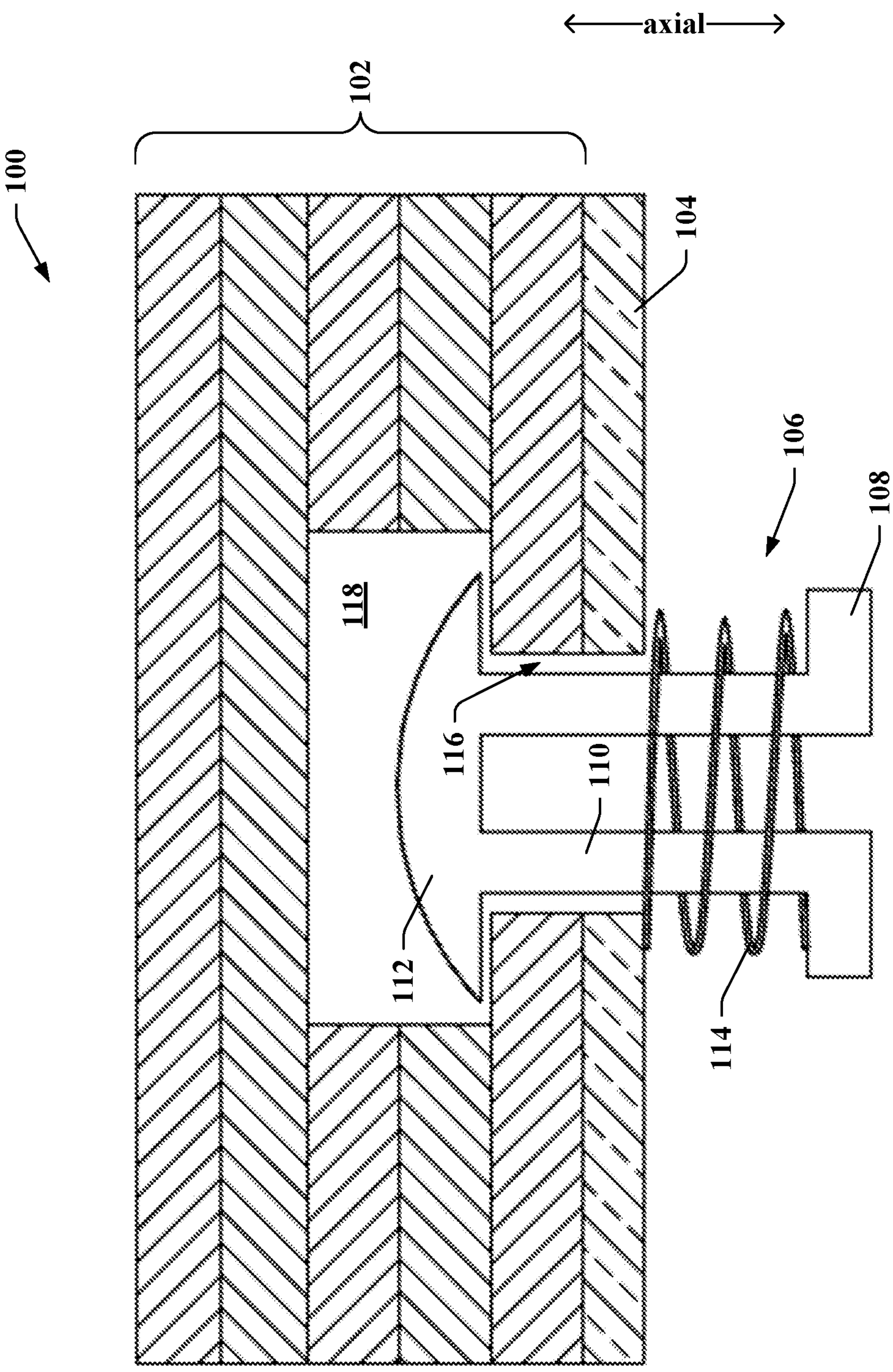
FIG. 1 illustrates a PCBA waveguide assembly secured with a spring-loaded rivet.

Various technologies pertaining to securing radar components together are described herein. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

In sensor systems such as radar, lidar, sonar, camera, etc. sensor systems, it is desirable that there be no gap between a waveguide and a printed circuit board assembly (PCBA). In a radar sensor, the primary transmitting and receiving antennas are often integrated into the PCBA. It is desirable to provide a gap-free connection between the PCBA and the waveguide to avoid signal losses.

Often the connection between the waveguide and the PCBA is made using screws. For example, the waveguide may comprise one or more threaded or tapped holes for receiving a screw. Corresponding holes are provided in the PCBA and aligned with the threaded holes in the waveguide. A screw is inserted through each hole in the PCBA and screwed into the corresponding threaded hole in the waveguide to secure the PCBA and the waveguide together. In this case, the screw heads abut the PCBA.

Another way of coupling a waveguide to a PCBA is to provide aligned holes through the waveguide and the PCBA through which screws are passed, the screws then mating with threaded holes in a substrate such as an aluminum plate or housing. In this case, the screw heads abut the waveguide and optionally may be countersunk. The above mentioned coupling techniques are subject to electromagnetic interference (EMI) problems that can occur due to creeping such as EMI leakage.

In contrast to fasteners such as screws, rivets are robust with regard to withstanding shear load. Described herein is a rivet having an elastic material section (e.g., monolithic or an assembly) that provides a low spring stiffness relative to the stiffness of clamped parts and/or expectable creeping and/or thermal expansion. The elastic material section, also referred to herein as a "spring element," provides an axial clamping force. In one embodiment, the rivet is a blind rivet. The elastic material section may be, for example, a coil spring, a deformable sheet metal spring, an elastic material with a low creeping coefficient (e.g., a bushing), etc.

With reference now to FIG. 1, a PCBA waveguide assembly 100 is illustrated. The assembly 100 comprises a waveguide 102, which is illustrated as a multilayer assembly although may comprise a single layer in some embodiments, and a PCBA 104. The PCBA, when used in a sensor (e.g., radar, lidar, camera, sonar, etc.), is a substrate comprising receive and transmit antennas. The waveguide is coupled to the PCBA to funnel or direct signals to and from the PCBA. PCBA materials used for radar sensors can include, e.g., Teflon materials, ceramic materials, hydrocarbon materials, etc. On the other hand, waveguide materials used in radar sensors often include highly conductive materials such as stainless steel or copper. These materials typically have different thermal properties such as coefficient of thermal expansion, and therefore respond differently to fluctuations in temperature. Because radar sensors may be manufactured in a climate-controlled environment and then deployed in different regions throughout the world, it is desirable to employ a fastener that can accommodate the different thermal responses of the waveguide and the PCBA.

For example, radar sensors manufactured in the same facility may be deployed on autonomous vehicles that are then sent to different geographical regions, e.g., a desert region and a frigid region. The sensor in the desert region will be subject to much higher temperatures than the temperature in the manufacturing facility, causing the waveguide and PCBA to expand. Moreover, the waveguide and PCBA will expand at different rates and by different amounts due to their differing thermal properties. Similarly, the sensor in the frigid region will be subject to much lower temperatures than the temperature in the manufacturing facility, causing the waveguide and PCBA to contract. Again, the waveguide and PCBA will contract at different rates and by different amounts due to their differing thermal properties.

Additionally, a sensor deployed on a single vehicle may be subject to extreme temperature ranges. For example, an autonomous vehicle deployed in a desert region with extremely high daytime temperatures may be exposed to extremely low nighttime temperatures or may travel to and from a low temperature region such as a mountainous region. Moreover, the sensor can be subject to seasonal temperature changes, such as sustained summer temperatures above 40° C. and sustained winter temperatures below −40° C. In another example, a sensor deployed on an aircraft may sit on a hot runway for extended periods of time and then, after takeoff, rapidly ascend to altitude where temperatures are extremely cold. In these scenarios, conventional rigid fasteners such as screws, bolts, etc., do not provide adequate flexibility to accommodate thermal expansion and contraction, creeping, shear forces associated therewith, and the like.

Accordingly, a spring-loaded rivet 106 is provided that has a rivet head 108, a rivet shank 110, and a rivet tail 112. A spring element 114 is positioned around the rivet shank 110 and provides flexibility in the fastening force provided by the rivet 106, which facilitates accommodating thermal expansion and/or creeping. For instance, as the waveguide 102 and/or the PCBA 104 expand (e.g., due to increased temperatures, decreased pressure, etc.) in an axial direction, the spring element 114 compresses, which allows the rivet to firmly secure the waveguide 102 to the PCBA 104. Similarly when the waveguide 102 and/or the PCBA 104 contract (e.g., due to decreased temperatures, increased pressure, etc.) in an axial direction, the spring portion 108 can expand to maintain a gapless connection between the waveguide 102 and the PCBA 104. Also visible in FIG. 1 is a rivet channel 116 that passes through the PCBA 104 and into the waveguide 102 and a rivet chamber 118 in which the rivet tail 112 is deformed during rivet installation.

The described PCBA waveguide assembly 100 provides more space in the front layer of the waveguide than conventional assemblies because no through hole is required across the entire waveguide portion of the assembly. This provides additional operational space within the waveguide structure when compared to conventional waveguides, which facilitates reducing the overall dimensions of a radar sensor employing the PCBA waveguide assembly 100. Additionally, since the waveguide assembly 102 has a closed upper layer (i.e., without a through hole), the PCBA 104 is shielded from EMI. This feature mitigates a need for additional EMI prevention measures, which reduces parts and/or production steps.

The described spring loaded rivet 106 provides a constant clamping force over time and accommodates creeping. The spring element 114 provides a spring stiffness that is lower than the stiffness of a screw type fastener. The spring element 114 accommodates movement in the PCBA 104 and waveguide layers 102 (e.g., due to thermal expansion and contraction, vibration, creeping, etc.) more readily than a screw type fastener. Moreover, screw type fasteners are prone to reduction in clamping force provided over time due to events such as preload loss and creeping. In contrast, the described spring element 114 does not require a large initial mounting force like a screw does.

In this manner, the spring loaded rivet 106 reduces costs, improves reliability, and provides a scalable solution for securing two or more components together. Additionally, the spring loaded rivet 106 allows movement in the sheer direction (i.e., perpendicular to its axial clamping force direction), which reduces stress and strain in the components clamped together by the rivet, such as can be caused by temperature, creeping, vibration, etc. Moreover, the compression force provided by the spring loaded rivet 106 mitigates peeling of the waveguide layers.

Figure 2:
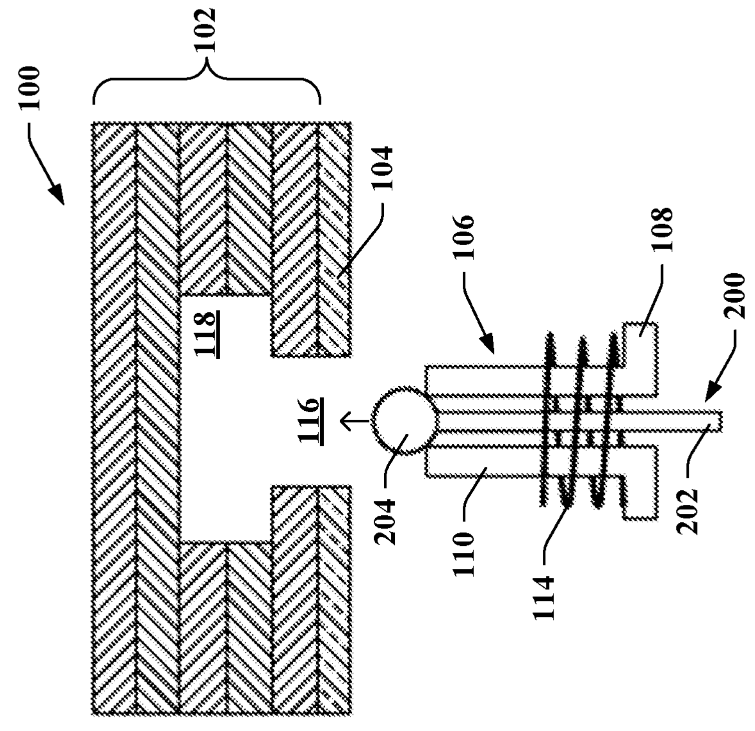
FIG. 2 illustrates a first stage of an assembly sequence showing insertion of the spring loaded rivet into a rivet channel and rivet chamber.

FIGS. 2-6 illustrate an assembly sequence for assembling the PCBA waveguide assembly 100 using the described spring loaded rivet 106 to securely couple the waveguide 102 to the PCBA 104. With reference to FIG. 2, the first stage of the assembly sequence shows insertion of the spring loaded rivet 106 into the rivet channel 116 and rivet chamber 118. A mandrel 200 is provided for forming the rivet tail 112 (FIG. 1) and comprises a shank portion 202 and a head portion 204. The shank portion 202 of the mandrel 200 is inserted through the shank 110 of the rivet 106 until the head portion 204 of the mandrel 200 abuts the tail 112 of the rivet 106. The rivet head 108 and spring element 114 are also shown.

Figure 3:
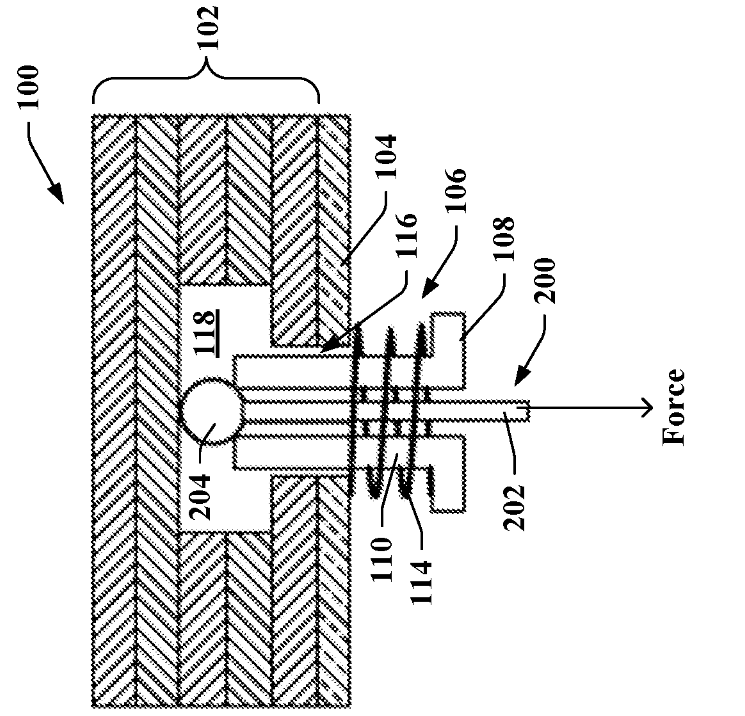
FIG. 3 illustrates a second stage of the assembly sequence wherein force is applied to the shank of the mandrel in a first direction while force is applied to the head of the rivet in a second direction that is opposite the first direction.

FIG. 3 illustrates a second stage of the assembly sequence wherein force is applied to the shank 202 of the mandrel 200 in a first direction while force is applied to the head 108 of the rivet 106 in a second direction that is opposite the first direction. The shank 110 of the rivet 106 has been inserted through the rivet channel 116 that traverses the PCBA 104 and the waveguide 102 into the rivet chamber 118 in the waveguide 102.

Figure 4:
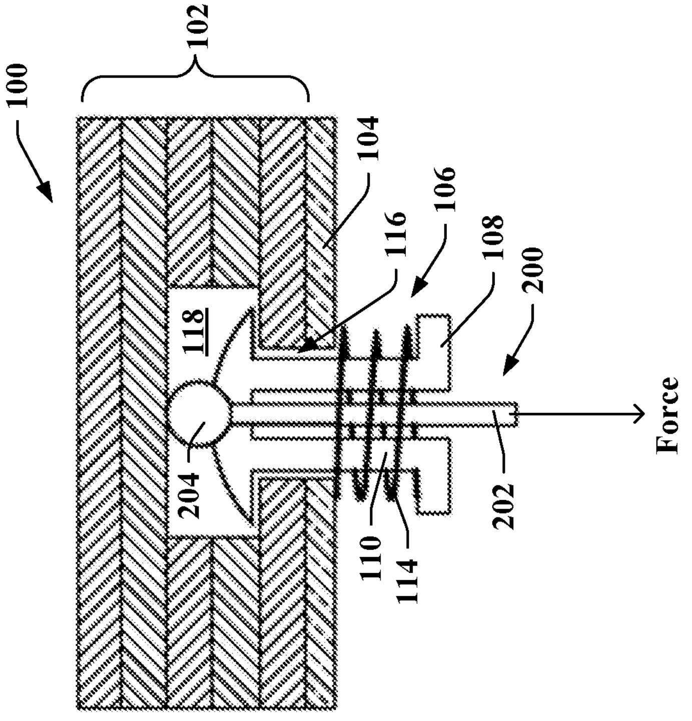
FIG. 4 illustrates a third stage of the assembly sequence wherein the tail of the rivet is formed.

FIG. 4 illustrates a third stage of the assembly sequence wherein the tail 112 of the rivet 106 is formed. While biasing the head 108 of the rivet 106 toward the PCBA 104, the force applied to the mandrel shank 202 forms the rivet tail 112 in the rivet chamber of the waveguide 102. The spring element 114 is in a quasi-compressed state from which it can expand when the waveguide 102 and/or the PCBA 104 contract. When the PCBA and/or the waveguide 102 expand, the spring element 114 can be further compressed to maintain sufficient force to seal the waveguide 102 against the PCBA 104.

Figure 5:
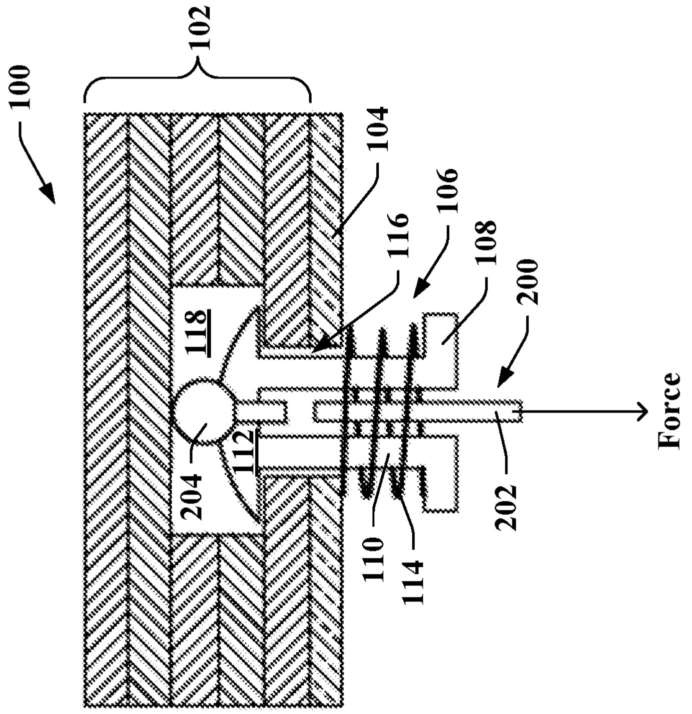
FIG. 5 illustrates a fourth stage of the assembly sequence wherein the shank of the mandrel breaks off due to continued force in the first direction (illustrated as a downward force) on the mandrel shank after the rivet tail has been formed.

FIG. 5 illustrates a fourth stage of the assembly sequence wherein the shank 202 of the mandrel 200 breaks off due to continued force in the first direction (illustrated as a downward force) on the mandrel shank 202 after the rivet tail 112 has been formed. The head 204 of the mandrel 200 remains in the rivet chamber 118 after the rivet tail 112 has been formed. The rivet head 108, in conjunction with the quasi-compressed spring element 114, biases the PCBA 104 toward the waveguide 102. The rivet tail 112 biases the waveguide 102 toward the PCBA 104.

Figure 6:
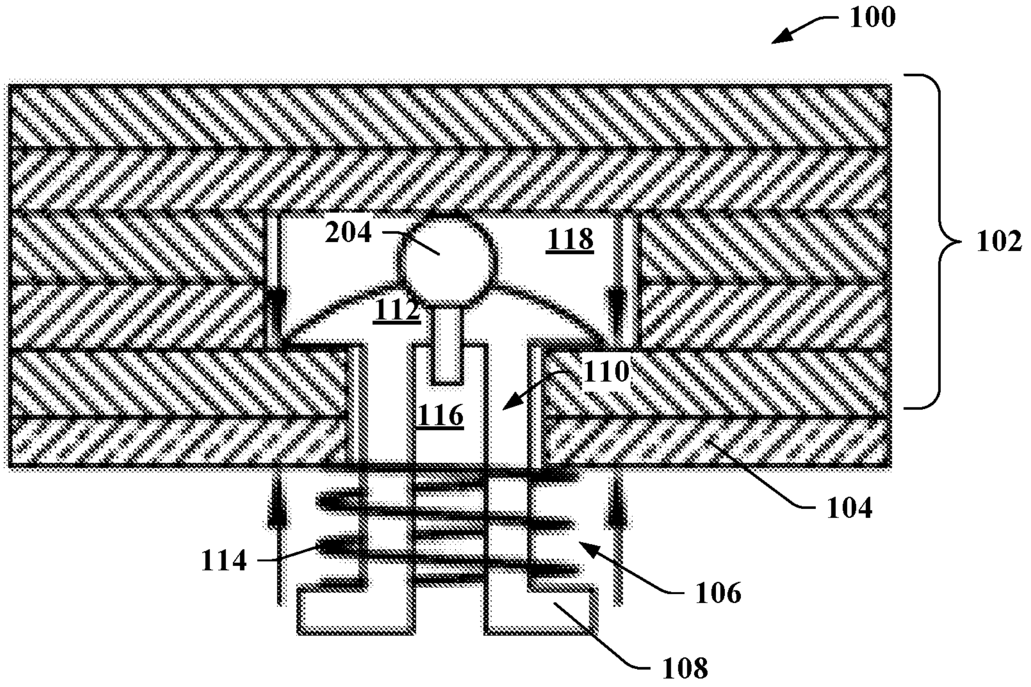
FIG. 6 illustrates a fifth stage of the assembly sequence wherein the shank of the mandrel has been removed and the finished spring loaded rivet remains.

FIG. 6 illustrates a fifth stage of the assembly sequence wherein the shank 202 of the mandrel 200 has been removed and the finished spring loaded rivet 106 remains. The spring element 114 is in a quasi-compressed state between the head 108 of the rivet 106 and the PCBA 104. The head 204 of the mandrel 200 is left in the rivet chamber 118 along with the formed rivet tail 112. The head 108, in conjunction with the quasi-compressed spring element 114, biases the PCBA 104 toward the waveguide 102. The rivet tail 112 biases the waveguide 102 toward the PCBA 104. The force applied to the waveguide 102 by the rivet tail 112 is shown by the downward-pointing arrows, and the force applied to the PCBA 104 by the rivet head 108 and spring element 114 is shown by the upward-pointing arrows.

Figure 7:
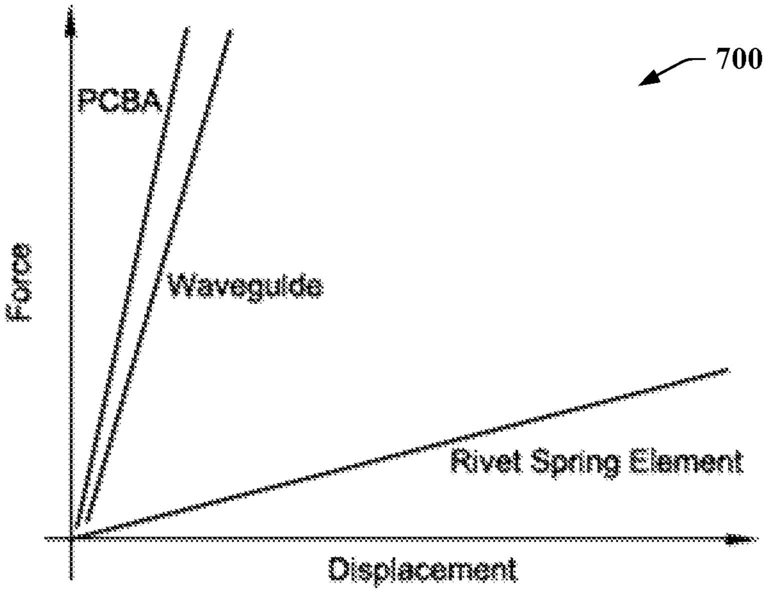
FIG. 7 illustrates a plot showing the relationship between force and displacement for the various components of the waveguide PCBA assembly.

FIG. 7 illustrates a plot 700 showing the relationship between force and displacement for the various components of the waveguide PCBA assembly 100. The plot 700 shows force on the y-axis and displacement on the x-axis. As can be seen, the force experienced by the PCBA rises most rapidly with the displacement. The force experienced by the waveguide also rises rapidly with displacement, but not as rapidly as the force experienced by the PCBA. The force experienced by the rivet spring element increases more slowly than the force experienced by either the PCBA or the waveguide.

Figure 8:
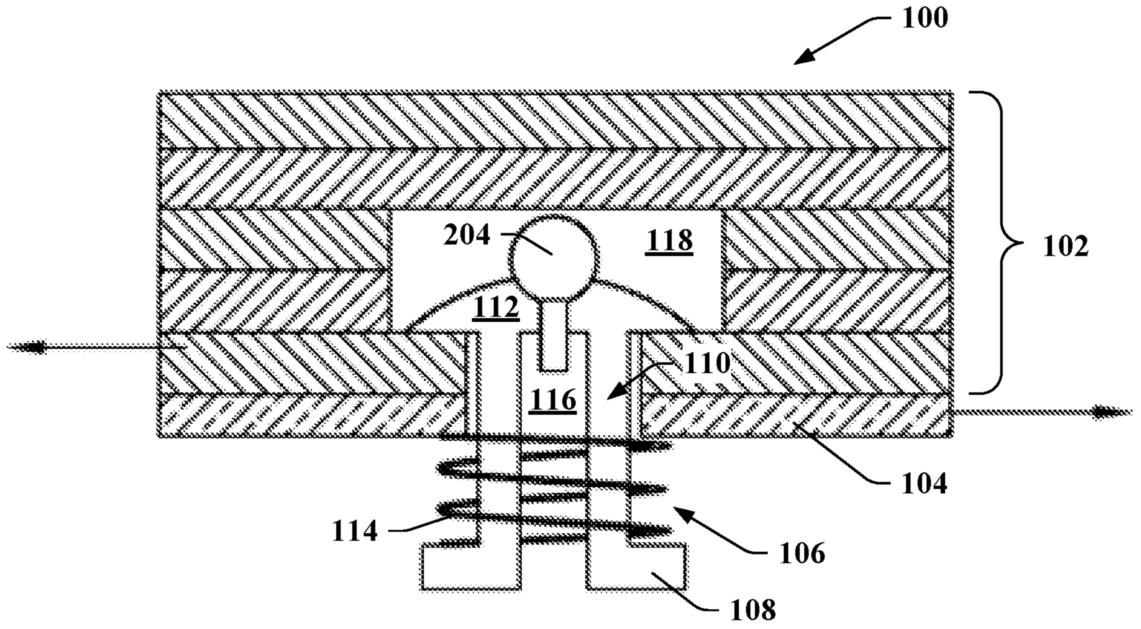
FIG. 8 shows additional features of the waveguide PCBA assembly with the spring loaded rivet as they pertain to shear forces.

FIG. 8 shows additional features of the PCBA waveguide assembly 100 with the spring loaded rivet 106 as they pertain to shear forces (illustrated by the leftward and rightward arrows). The rivet channel 116 into the waveguide 102 and through the PCBA 104, through which the rivet shank 110 is passed into the rivet chamber during assembly to form the rivet head 112, is slightly wider than the rivet shank 110 to permit sheer movement such as may be caused by thermal expansion, vibration, creeping, or other physical effects, etc. The spring element 114, rivet head 108, and mandrel head 204 are also visible in FIG. 8.

The rivet channel 116 is oversized relative to the rivet shank 110, so that the rivet channel 116 has a clearance c that represents the difference between the diameter of the rivet channel 116 and the diameter of the rivet shank 110. The following description provides an example of the manner in which the channel clearance, c, can be calculated.

A value, $a_{nominal}$, describes a maximum allowable displacement of a bore in the waveguide compared to a bore in the PCBA, where the waveguide and PCBA bores form the rivet channel. Temperature values $T_{mount}$, $T_{max}$, and $T_{min}$ are defined, where $T_{mount}$ is the temperature at which the assembly is manufactured (e.g., approximately 20° C. or the like), $T_{max}$ is the maximum temperature expected to be experienced by the assembly during its lifetime (e.g., during operation, storage, etc.), and $T_{min}$ is the maximum temperature expected to be experienced by the assembly during its lifetime.

A value, $p_{rivet}$, describes the distance from the symmetrical center of the assembly (the zero point of thermal expansion) to the rivet axis. Coefficients of thermal expansion for the waveguide and the PCBA are $CTE_{waveguide}$ and $CTE_{PCBA}$, respectively. The thermal expansion of the PCBA and waveguide are calculated as:

$$a_{ThermalPCBA} = CTE_{PCBA} \times p_{rivet} \times (T_{min/max} - T_{mount}); \text{ and}$$

$$a_{ThermalWaveguide} = CTE_{Waveguide} \times p_{rivet} \times (T_{min/max} - T_{mount});$$

where $T_{min/max}$ is the greater of the absolute values of $T_{min}$ and $T_{max}$. That is, if the absolute value of $T_{min}$ is greater than the absolute value of $T_{max}$, then $T_{min}$ is selected. If the absolute value of $T_{max}$ is greater than the absolute value of $T_{min}$, then $T_{max}$ is selected. Thermal displacement is calculated as:

$$a_{ThermalDiff} = a_{ThermalPCBA} - a_{ThermalWaveguide}.$$

The clearance, c, is calculated as:

$$c = 2 \times (|a_{ThermalDiff}| + |a_{nominal}|).$$

Figure 9:
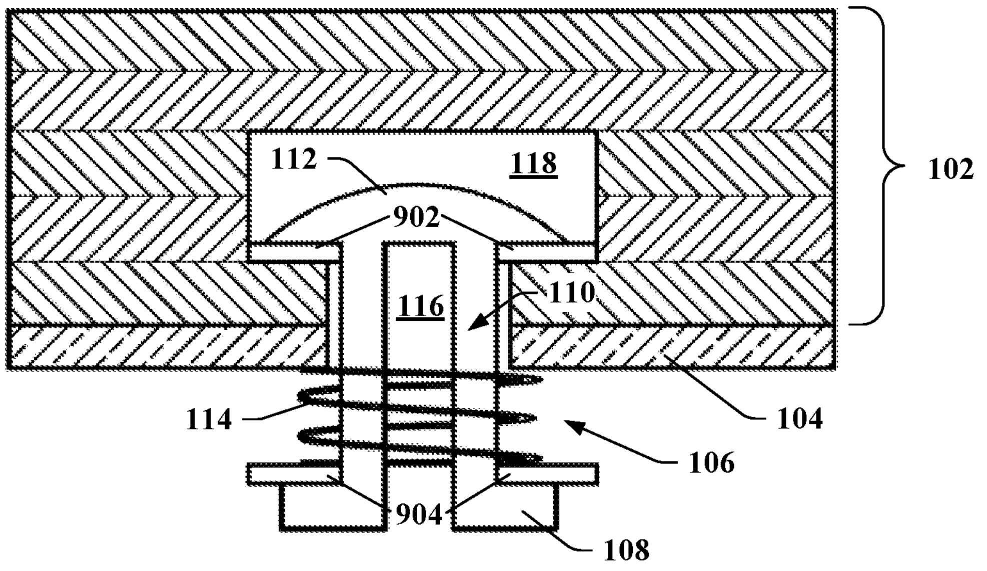
FIG. 9 illustrates an embodiment of the spring loaded rivet in which washers are employed to facilitate force transfer between the rivet tail and the waveguide, and between the rivet head and the PCBA, via the spring element.

FIG. 9 illustrates an embodiment of the spring loaded rivet 106 in which washers 902, 904 are employed to facilitate force transfer between the rivet tail 112 and the waveguide 102, and the rivet head 108 and the PCBA, via the spring element 114. A rivet tail washer 902 (shown in cross section) is positioned between the rivet tail 112 and the waveguide in the rivet chamber 118. A rivet head washer 904 (shown in cross section) is positioned between the rivet head 108 and the spring element 114.

Figure 10:
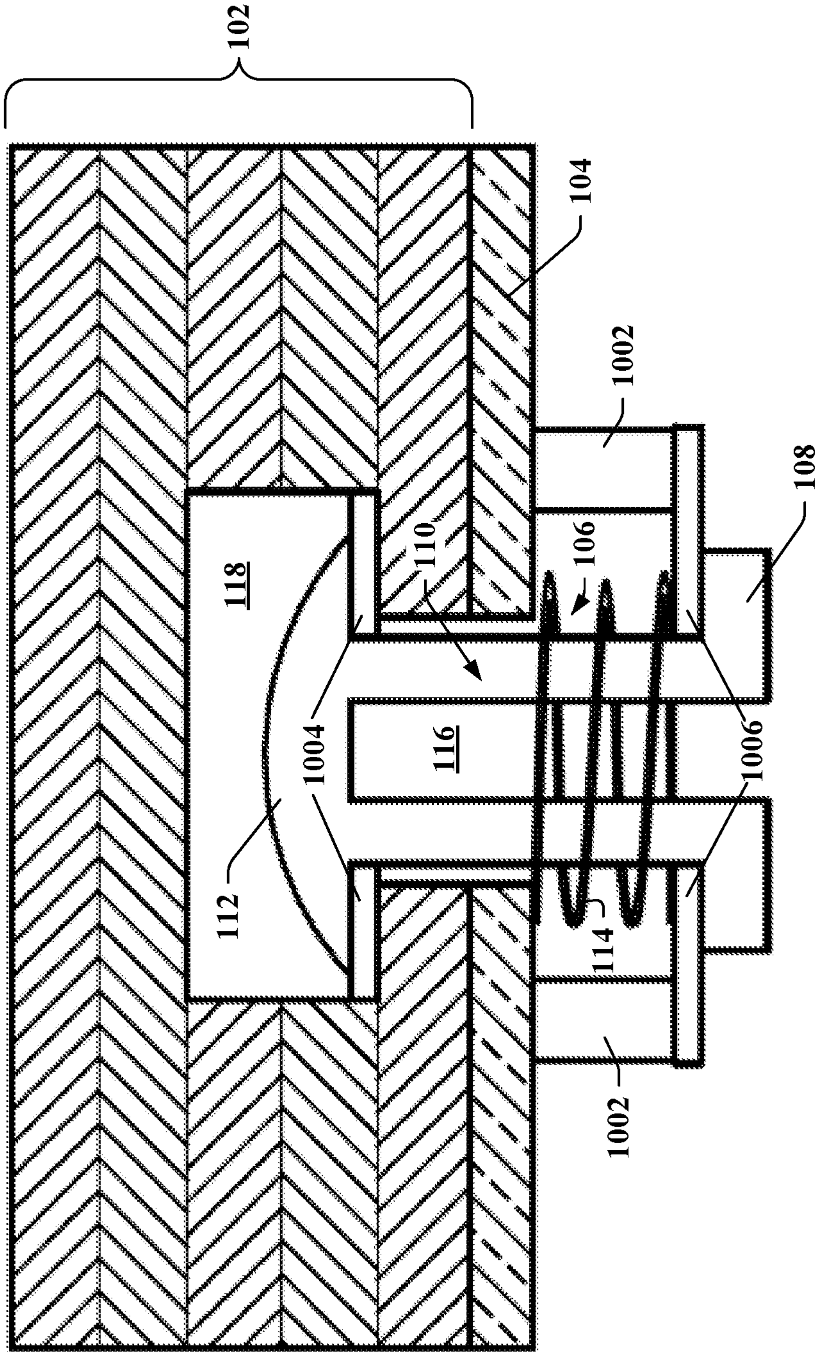
FIG. 10 illustrates an embodiment of the spring loaded rivet in which hard stop elements are employed during formation of the rivet tail.

FIG. 10 illustrates an embodiment of the spring loaded rivet 106 in which hard stop elements 1002 are employed during formation of the rivet tail 112. The waveguide 102 is coupled to the PCBA by the rivet 106, a rivet tail washer 1004 (shown in cross section) is provided to facilitate force transfer between the rivet tail 112 and the waveguide. A rivet head washer 1006 is positioned between the spring element 114 and the rivet head 108 and abuts the hard stop elements 1002. The hard stop elements 1002 permit the rivet to be formed with a predefined space between the PCBA 104 and the rivet head 108. The predefined space is occupied by the spring element 114 in its quasi-compressed state. In this manner, the spring element 114 can be compressed to a desired position so that it can expand as the PCBA and/or waveguide contract, or contract as the PCBA and/or waveguide expand, as needed.

Figure 11:
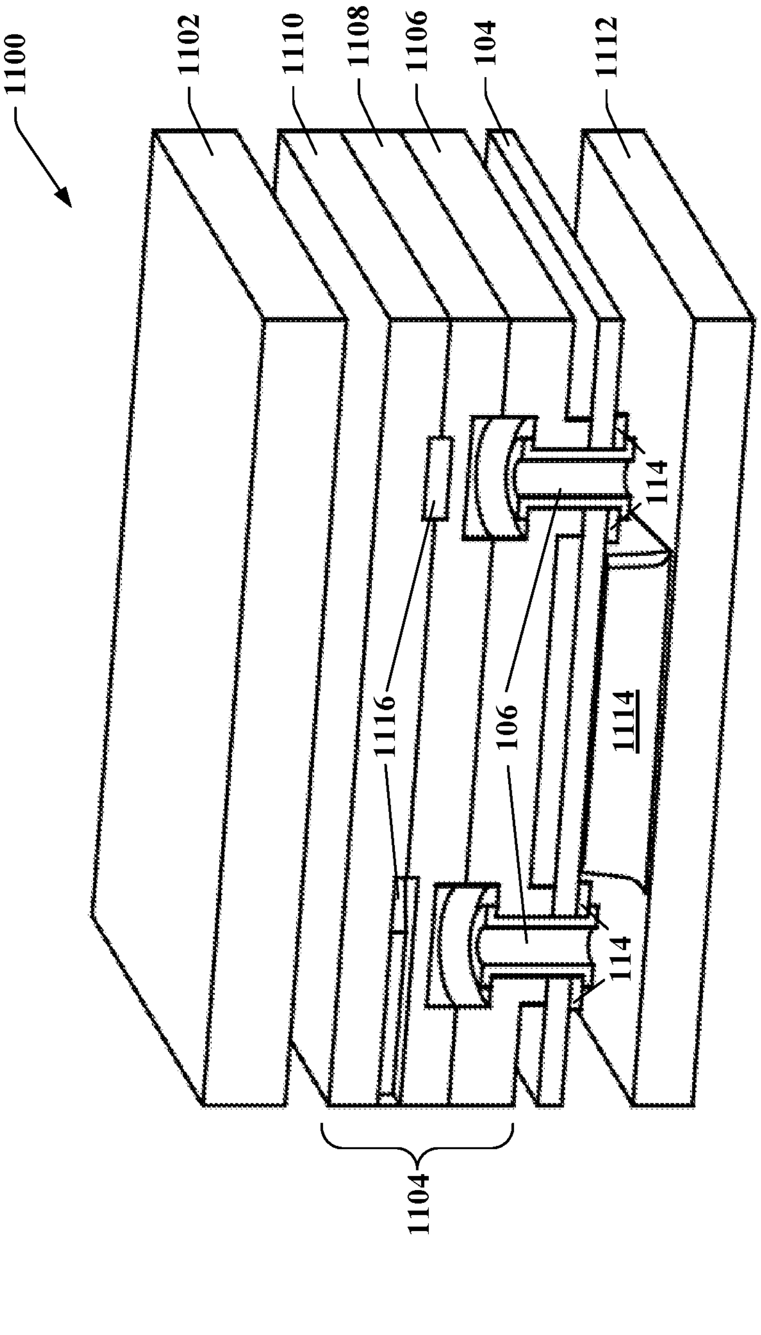
FIG. 11 illustrates an example of a waveguide PCBA structure comprising a single or multilayer waveguide element coupled to the PCBA using spring loaded rivets.

FIG. 11 illustrates an example of a waveguide PCBA structure 1100 comprising a single or multilayer waveguide element 1104 coupled to the PCBA 104 using spring loaded rivets 106. A radome 1102 is coupled to the waveguide element 1104, which comprises a plurality of waveguide layers 1106, 1108, 1110. A first waveguide layer 1106 is coupled to the PCBA 104 using spring-loaded rivets 106 passed through the PCBA. The PCBA is also coupled to a housing 1112 (e.g., an aluminum housing or the like). Layer 1106 is a closed layer, which mitigates EMI. Also illustrated are rivet head washers 1114 between the rivet heads 108 and the PCBA 104. Waveguide structures 1114 (e.g., pipe(s), etc.) are shown between layers 1108 and 1110.

Figure 12:
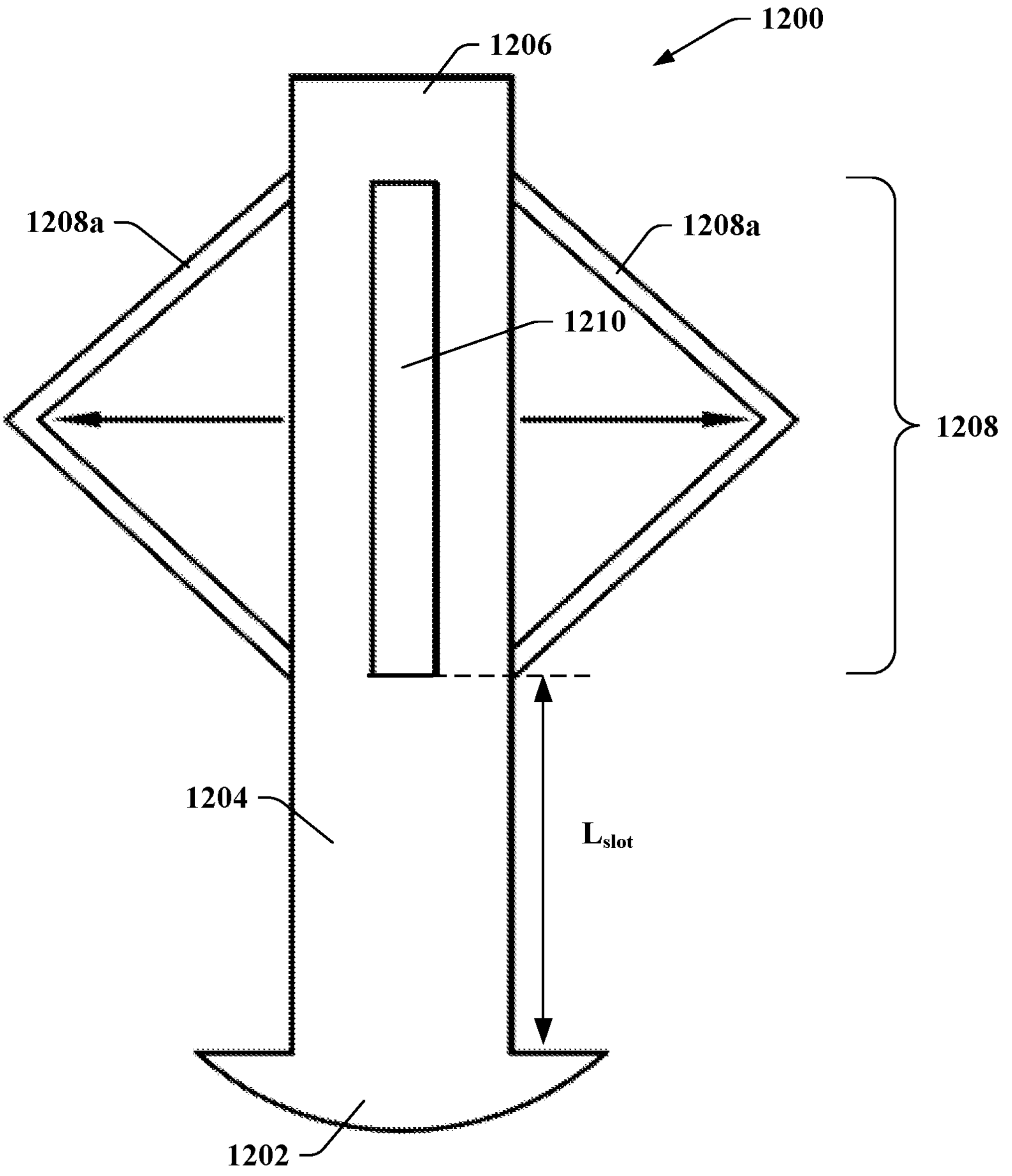
FIG. 12 illustrates an example of a slotted rivet, such as may be employed in conjunction with various aspects described herein.

FIG. 12 illustrates an example of a slotted rivet 1200, such as may be employed in conjunction with various aspects described herein. The rivet 1200 comprises A rivet head 1202 a rivet shank 1204 and a rivet tail 1206. The rivet tail 1206 comprises a slotted portion 1208 that folds outward during installation of the rivet 1200 and deformation of the rivet tail 1206, as illustrated by the arrows in FIG. 12. The distance between the rivet head 1202 and the slot 1210 represents the functional rivet length, $L_{slot}$, which accommodates the waveguide clamping thickness, the PCBA clamping thickness, and the spring element (not shown in FIG. 12).

Figure 13:
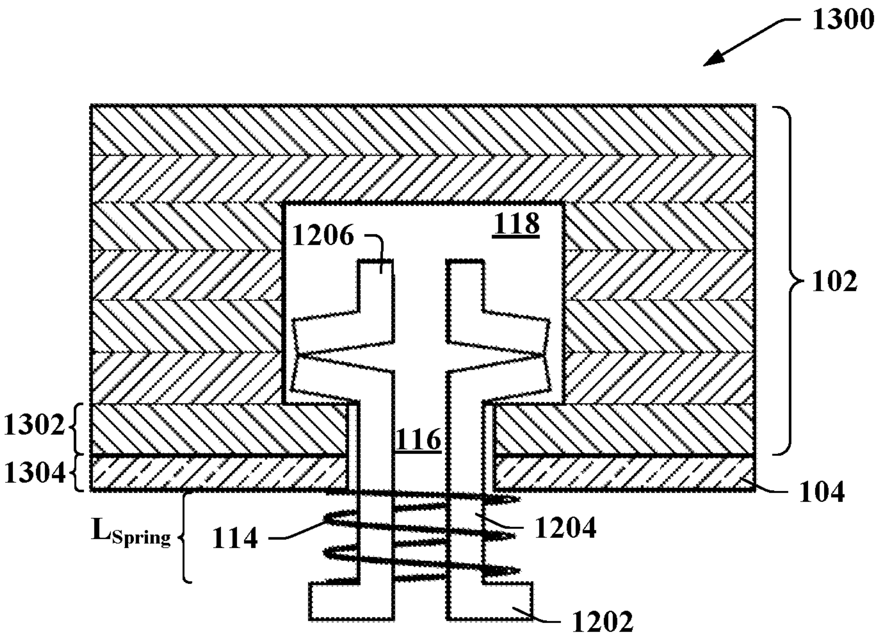
FIG. 13 illustrates another example of the PCBA waveguide assembly 100 employing the slotted rivet.

FIG. 13 illustrates another example of the PCBA waveguide assembly 100 employing the slotted rivet 1200 of FIG. 12. The assembly 100 includes the waveguide 102 and the PCBA 104. The slotted rivet 1200 comprises the rivet head 1202 and rivet shank 1204 around which the spring element 114 is positioned between the rivet head 1202 and the PCBA 104. The remainder of the rivet shank 1204 is positioned in the rivet channel 116, which extends through the waveguide clamping thickness 1302 and the PCBA clamping thickness 1304. The rivet tail 1206 has been deformed within the rivet chamber 118 to clamp the rivet 1200 against the waveguide 102 and the spring element 114. The gap bridged by the spring element 114 when the rivet 1200 is in its clamped state is labeled $L_{spring}$, which denotes the length of the spring element in its operational state as well as the distance between the PCBA 104 and the rivet head 1202.

According to an example, nominal compression of the spring due to spring tolerance (i.e., the difference between the unloaded spring length and the loaded spring length) can be calculated, for instance, as:

$$L_{Spring=(4\ \ldots\ 100)\times}\Delta L_{SpringTolerance},$$

which corresponds to a 1-25% force deviation due to spring tolerance. Nominal compression of the spring due to thermal expansion (e.g., depending on the change in gap size due to thermal expansion) can be calculated as:

$$L_{Spring} > 10\times\Delta L_{SpringThermal},$$

such that there is less than a 10% force deviation due to thermal expansion. Nominal compression of the spring due to creeping of the clamping stack (PCBA and waveguide clamping thicknesses) can be calculated as:

$$L_{Spring} > 100\times\Delta L_{SpringCreeping},$$

such that there is less than a 1% force deviation due to creeping. It will be understood that the forgoing example is illustrative in nature and not to be construed in a limiting sense.

Figure 14:
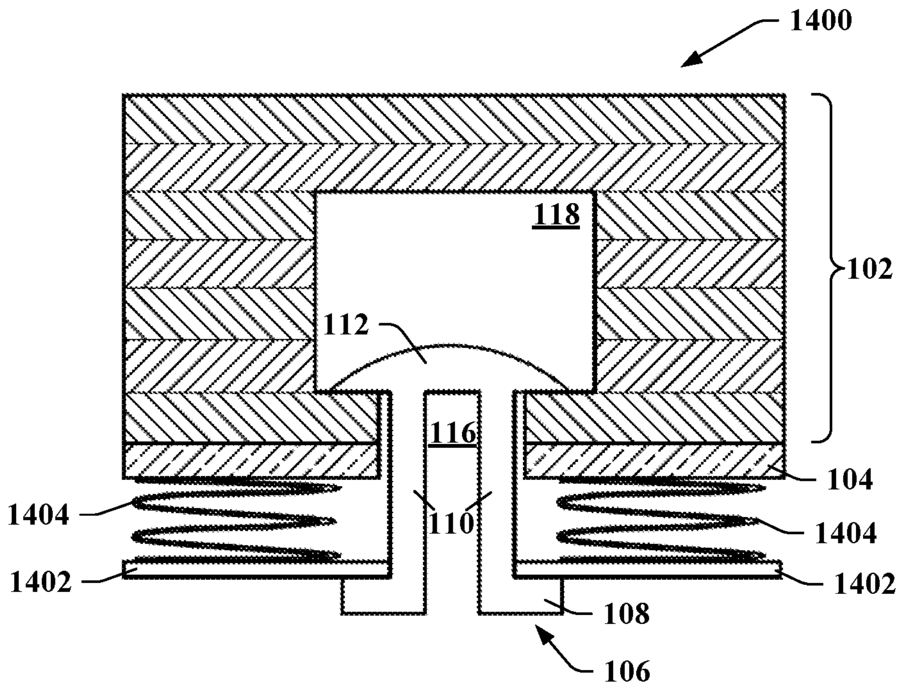
FIG. 14 illustrates an example of a spring-loaded rivet fastening system.

FIG. 14 illustrates an example of a spring-loaded rivet fastening system 1400. The system 1400 includes a rivet 106 for fastening together a single or multilayer waveguide 102 and a PCBA 104. The rivet 106 comprises a rivet head 108, a rivet shank 110 positioned withing a rivet channel 116, and a rivet tail 112 that has been deformed within a rivet chamber 118. The system 100 also comprises a washer 1402 (shown in cross section) positioned about the rivet shaft and adjacent to the rivet head. Spring elements 1404 are provided between the washer 1402 and the PCBA 104. The spring elements 1404 may be, e.g., wire springs (e.g., round or flat wire), wave springs, a compressible material such as a rubber, plastic, or combination thereof, or any other suitable spring element.

In one embodiment, the spring elements 1404 are positioned on either side of the rivet 106. In another embodiment, more than two spring elements 1404 are positioned circumferentially around the rivet 106.

Figure 15:
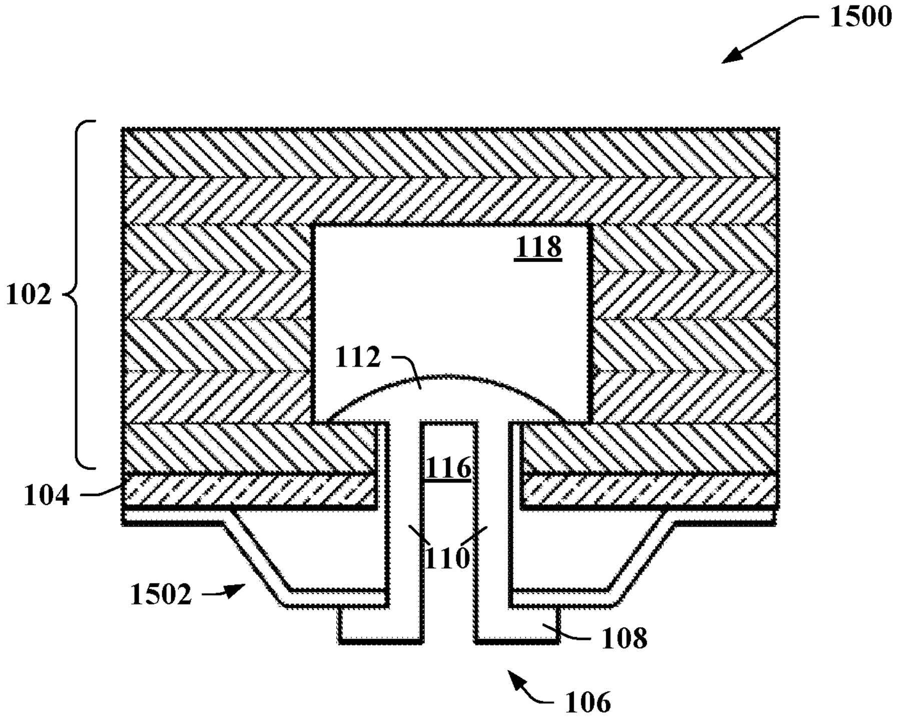
FIG. 15 illustrates another example of a spring-loaded rivet fastening system.

FIG. 15 illustrates another example of a spring-loaded rivet fastening system 1500. The system 1500 includes a rivet 106 for fastening together a single or multilayer waveguide 102 and a PCBA 104. The rivet 106 comprises a rivet head 108, a rivet shank 110 positioned withing a rivet channel 116, and a rivet tail 112 that has been deformed within a rivet chamber 118. The system 1500 also comprises a bendable spring element 1502 (shown in cross section), which may be formed of, e.g., sheet metal, plastic(s), or the like. The bendable spring element 1502 is positioned around the rivet shaft 110 and adjacent to the rivet head 108.

Figure 16:
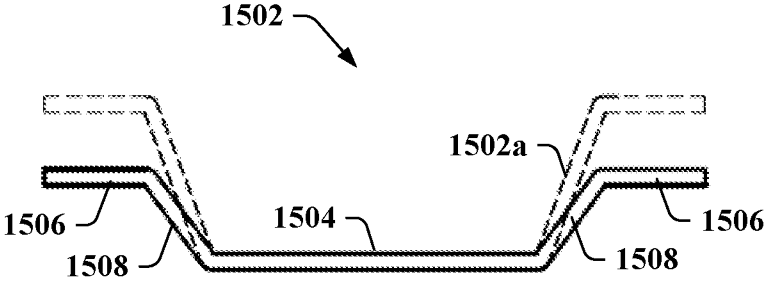
FIG. 16 illustrates the bendable spring element in its compressed state, as well as and uncompressed bendable spring element prior to compression during rivet installation.

FIG. 16 illustrates the bendable spring element 1502 in its compressed state as shown in FIG. 15, as well as an uncompressed bendable spring element 1502*a* (dashed lines), prior to compression during rivet installation. The bendable spring element 1502 comprises a central portion 1604 that is positioned around and accommodates the rivet shaft 110, and an outer portion 1606 that is positioned adjacent to the PCBA 102. A bendable portion 1608 lies between the central portion 1604 and the outer portion 1606 and provides a spring force for the installed rivet 106. In one embodiment, the bendable spring element 1602 comprises a ring-shaped central portion from which extend a plurality of finger-like bendable portions 1608 and outer portions 1606.

Figure 17:
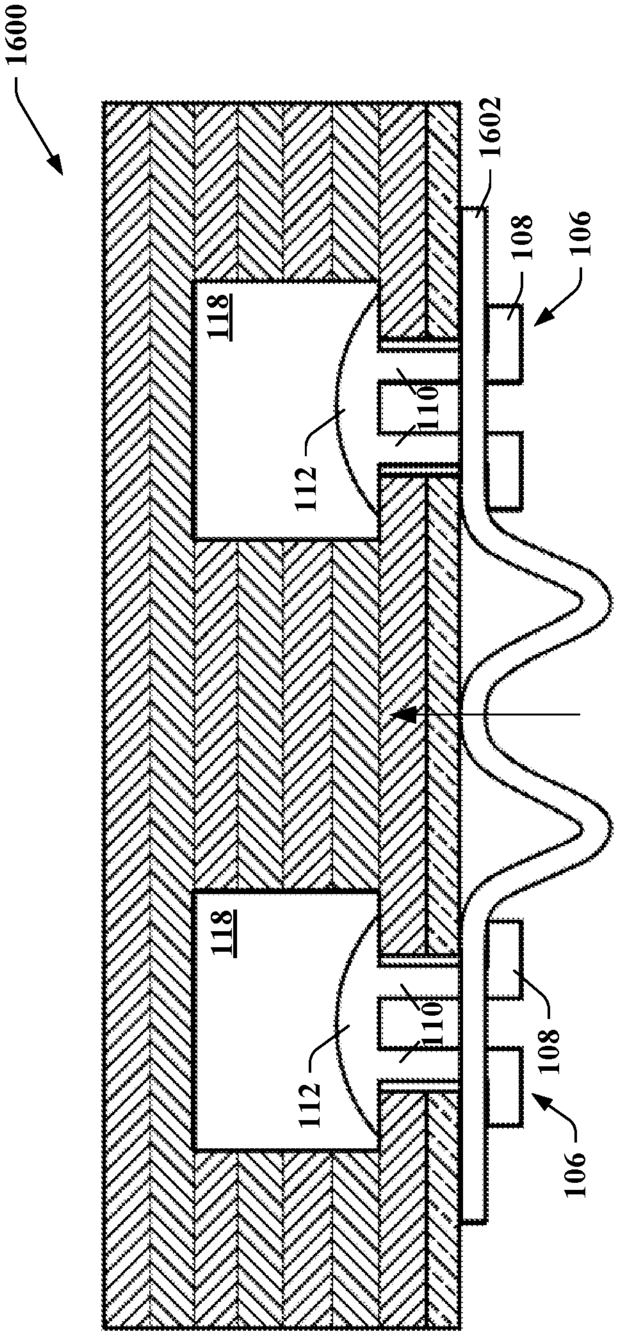
FIG. 17 illustrates another example of a spring-loaded rivet fastening system.

FIG. 17 illustrates another example of a spring-loaded rivet fastening system 1700. The system 1700 includes multiple rivets 106 for fastening together a single or multilayer waveguide 102 and a PCBA 104. The rivets 106 each comprise a rivet head 108, a rivet shank 110, and a rivet tail 112 that has been deformed within a rivet chamber 118. The system 1700 also comprises a multi-rivet spring element 1702 configured to provide spring force to two or more rivets. The multi-rivet spring element 1702 may be formed of, e.g., sheet metal, plastic(s), or any other suitable material.

Figure 18:
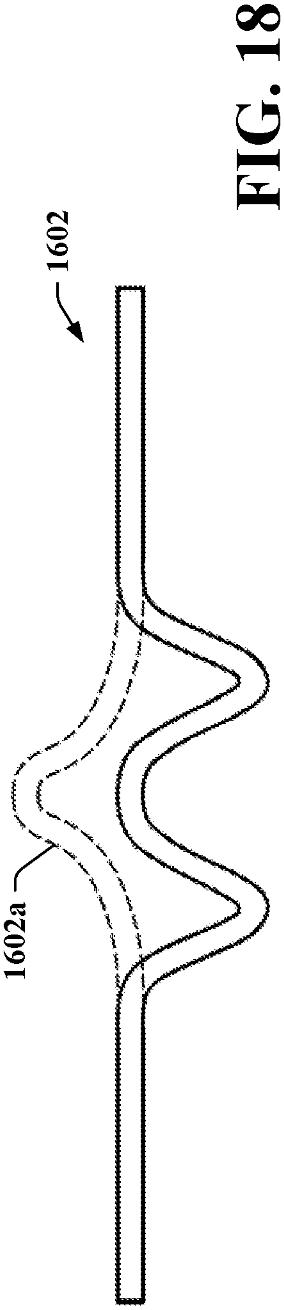
FIG. 18 shows a multi-rivet spring element in its compressed state as well as an uncompressed multi-rivet spring element, prior to installation.

FIG. 18 shows the multi-rivet spring element 1702 in its compressed state as shown in FIG. 17, as well as an uncompressed multi-rivet spring element 1702*a*, prior to installation. It will be understood that the multi-rivet spring element comprises holes or apertures (not visible in the cross-sectional view of FIGS. 17 and 18) through which the rivet shank 110 and tail 112 are placed prior to rivet installation.

Figure 19:
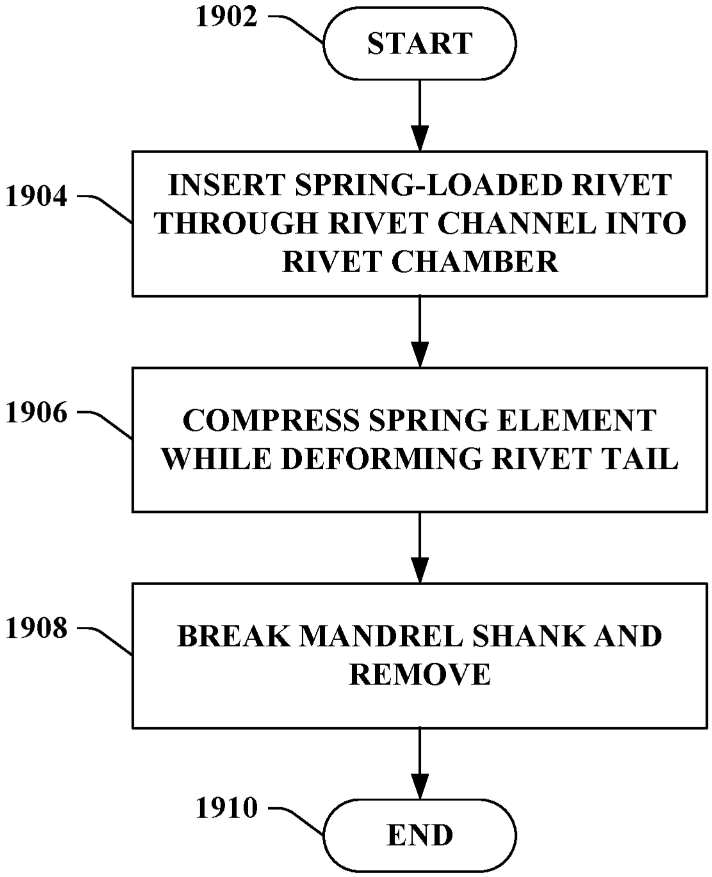
FIG. 19 illustrates an exemplary methodology relating to installing a spring-loaded rivet to secure together a waveguide and PCBA

FIG. 19 illustrates an exemplary methodology relating to installing a spring-loaded rivet to secure together a waveguide and PCBA, in accordance with various aspects described herein. While the methodology is shown and described as being a series of acts that are performed in a sequence, it is to be understood and appreciated that the methodology is not limited by the order of the sequence. For example, some acts can occur in a different order than is described herein. In addition, an act can occur concurrently with another act. Further, in some instances, not all acts may be required to implement a methodology described herein.

The method begins at 1902. At 1904, a spring-loaded rivet is inserted through a rivet channel into a rivet chamber in a waveguide. The rivet channel passes through a PCBA and into the waveguide to which the PCBA is to be secured by the spring loaded rivet. The rivet channel is designed to be slightly wider than the rivet shank to accommodate thermal expansion and/or shear forces. The spring loaded rivet comprises a rivet head, a rivet shank, and a rivet tail. The spring loaded rivet is inserted into the rivet chamber, tail first. A spring element is positioned around the rivet shank and adjacent to the rivet head. The spring element has a larger diameter than the rivet channel and abuts the PCBA when the spring loaded rivet is inserted into the rivet channel.

At 1906, the spring element is compressed as the rivet tail is deformed to clamp the waveguide and PCBA together. Deformation of the rivet tail is achieved by pulling the rivet tail toward the rivet head. In one embodiment, this is achieved using a mandrel that is passed through a channel extending through the spring loaded rivet from the rivet tail to the rivet head. The mandrel comprises in mandrel shank that extends longitudinally through the spring loaded rivet and out the rivet head, and a mandrel head that abuts the rivet tail when the mandrel is installed in the rivet. As the mandrel shank is pulled outward through the rivet head, the mandrel head forces the rivet tail toward the rivet head.

At 1908, the mandrel shank is broken and removed. The mandrel shank is designed to break when a certain threshold force is applied thereto. This threshold force is a function of the desired rivet clamping force and compressed spring force and is achieved when the spring element has been sufficiently compressed and the spring loaded rivet has been sufficiently crimped onto the waveguide and PCBA layers. The method terminates at 1910.

Described herein are various technologies according to at least the following examples.

(A1) In an aspect, a printed circuit board assembly (PCBA) waveguide assembly includes a PCBA, a waveguide, and a spring-loaded rivet comprising a rivet head, a rivet shank, a rivet tail, and a spring element. The spring-loaded rivet fastens the PBCA to the waveguide.

(A2) In some embodiments of the PCBA waveguide assembly of (A1), the rivet tail is deformed during installation and provides a clamping force that biases the waveguide toward the PCBA. Additionally, the rivet head provides a clamping force that biases the PCBA toward the waveguide.

(A3) In some embodiments of the PCBA waveguide assembly of at least one of (A1)-(A2), the spring element includes a wire spring positioned around the rivet shank between the rivet head and the PCBA.

(A4) In some embodiments of the PCBA waveguide assembly of at least one of (A1)-(A3), the PCBA and the waveguide include a rivet channel in which the spring-loaded rivet is positioned.

(A5) In some embodiments of the PCBA waveguide assembly of (A4), the rivet channel has a larger diameter than the rivet shank.

(A6) In some embodiments of the PCBA waveguide assembly of at least one of (A4)-(A5), the spring element has a larger diameter than the rivet channel.

(A7) In some embodiments of the PCBA waveguide assembly of at least one of (A1)-(A6), the spring element includes a sheet metal spring.

(A8) In some embodiments of the PCBA waveguide assembly of at least one of (A1)-(A7), the spring element includes an elastic bushing.

(A9) In some embodiments of the PCBA waveguide assembly of at least one of (A1)-(A8), the spring-loaded rivet is a blind rivet.

(A10) In some embodiments of the PCBA waveguide assembly of at least one of (A1)-(A9), the rivet tail is a slotted rivet tail.

(A11) In some embodiments of the PCBA waveguide assembly of at least one of (A1)-(A10), the PCBA waveguide assembly is deployed in a radar sensor.

(A12) In some embodiments of the PCBA waveguide assembly of at least one of (A1)-(A11), the PCBA waveguide assembly is deployed in an autonomous vehicle radar sensor.

(B1) In another aspect, a spring-loaded rivet includes a rivet head. The spring-loaded rivet also includes a rivet shank. The spring-loaded rivet further includes a rivet tail. The spring-loaded rivet also includes a spring element positioned around the rivet shank. The spring-loaded rivet fastens a first component to a second component.

(B2) In some embodiments of the spring-loaded rivet of (B1), the rivet tail provides a clamping force that biases the first component toward the second component, and wherein the rivet head provides a clamping force that biases the second component toward the first component.

(B3) In some embodiments of the spring-loaded rivet of at least one of (B1)-(B2), the spring element includes a wire spring that provides a spring force between the rivet head and the second component.

(B4) In some embodiments of the spring-loaded rivet of at least one of (B1)-(B3), the spring element includes a sheet metal spring.

(B5) In some embodiments of the spring-loaded rivet of at least one of (B1)-(B4), the spring element includes an elastic bushing.

(B6) In some embodiments of the spring-loaded rivet of at least one of (B1)-(B5), the spring-loaded rivet is a blind rivet.

(B7) In some embodiments of the spring-loaded rivet of at least one of (B1)-(B6), the spring-loaded rivet is deployed in an autonomous vehicle radar sensor.

(C1) In another aspect, a method for installing a spring-loaded rivet in a printed circuit board assembly (PCBA) waveguide assembly includes inserting the spring-loaded rivet into a rivet channel through the PCBA and extending into the waveguide until the rivet tail is positioned in a rivet chamber in the waveguide. The method also includes deforming the rivet tail in the rivet chamber until the rivet is fully installed and clamps the PCBA and the waveguide together. Deforming the rivet tail partially compresses a spring element positioned around a shank of the spring-loaded rivet and between a head of the rivet and the PCBA.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A printed circuit board assembly (PCBA) waveguide assembly, comprising:

a PCBA;

a waveguide; and a spring-loaded rivet comprising a rivet head, a rivet shank, a rivet tail, and a spring element;

wherein the PCBA and the waveguide comprise a rivet channel through the PCBA and extending into the waveguide, the waveguide comprising a rivet chamber, and wherein the spring-loaded rivet is positioned in the rivet channel with the rivet tail positioned in the rivet chamber; wherein the rivet tail is deformed in the rivet chamber until the spring-loaded rivet is fully installed and clamps the PCBA to and the waveguide together; and wherein deforming the rivet tail partially compresses the spring element positioned around the rivet shank and between the rivet head and the PCBA.

2. The PCBA waveguide assembly of claim 1, wherein the rivet tail is deformed during installation and provides a clamping force that biases the waveguide toward the PCBA, and wherein the rivet head provides a clamping force that biases the PCBA toward the waveguide.

3. The PCBA waveguide assembly of claim 1, wherein the spring element comprises a wire spring positioned around the rivet shank between the rivet head and the PCBA.

4. The PCBA waveguide assembly of claim 1, wherein the rivet channel is slightly wider than the rivet shank to permit shear movement.

5. The PCBA waveguide assembly of claim 1, wherein the rivet channel has a larger diameter than the rivet shank.

6. The PCBA waveguide assembly of claim 1, wherein the spring element has a larger diameter than the rivet channel.

7. The PCBA waveguide assembly of claim 1, wherein the spring element comprises a sheet metal spring.

8. The PCBA waveguide assembly of claim 1, wherein the spring element comprises an elastic bushing.

9. The PCBA waveguide assembly of claim 1, wherein the spring-loaded rivet is a blind rivet.

10. The PCBA waveguide assembly of claim 1, wherein the rivet tail is a slotted rivet tail.

11. The PCBA waveguide assembly of claim 1, deployed in a radar sensor.

12. The PCBA waveguide assembly of claim 1, deployed in an autonomous vehicle radar sensor.

13. A spring-loaded rivet, comprising:

a rivet head;

a rivet shank;

a rivet tail; and a spring element positioned around the rivet shank;

wherein the spring-loaded rivet fastens a printed circuit board assembly (PCBA) to a waveguide of a printed circuit board assembly (PCBA) waveguide assembly, the PCBA and the waveguide comprising a rivet channel through the PCBA and extending into the waveguide and the waveguide comprising a rivet chamber, and wherein the spring-loaded rivet is positioned in the rivet channel with the rivet tail positioned in the rivet chamber; wherein the rivet tail is deformed in the rivet chamber until the spring-loaded rivet is fully installed and clamps the PCBA and the waveguide together; and wherein deforming the rivet tail partially compresses the spring element positioned around the rivet shank and between the rivet head and the PCBA.

14. The spring-loaded rivet of claim 13, wherein the rivet tail provides a clamping force that biases the waveguide toward the PCBA, and wherein the rivet head provides a clamping force that biases the PCBA toward the waveguide.

15. The spring-loaded rivet of claim 13, wherein the spring element comprises a wire spring that provides a spring force between the rivet head and the PCBA.

16. The spring-loaded rivet of claim 13, wherein the spring element comprises a sheet metal spring.

17. The spring-loaded rivet of claim 13, wherein the spring element comprises an elastic bushing.

18. The spring-loaded rivet of claim 13, wherein the spring-loaded rivet is a blind rivet.

19. The spring-loaded rivet of claim 13, deployed in an autonomous vehicle radar sensor.

20. A method for installing a spring-loaded rivet in a printed circuit board assembly (PCBA) waveguide assembly, comprising:

inserting the spring-loaded rivet into a rivet channel through the PCBA and extending into the waveguide until the rivet tail is positioned in a rivet chamber in the waveguide; and deforming the rivet tail in the rivet chamber until the rivet is fully installed and clamps the PCBA and the waveguide together;

wherein deforming the rivet tail partially compresses a spring element positioned around a shank of the spring-loaded rivet and between a head of the rivet and the PCBA.

* * * * *